(12) United States Patent
Fukushima

(10) Patent No.: US 6,977,339 B2
(45) Date of Patent: Dec. 20, 2005

(54) SURFACE MOUNTING PACKAGE

(75) Inventor: Daisuke Fukushima, Shiga (JP)

(73) Assignee: NEC Schott Components Corporation, Minakuchi-cho (JP)

( * ) Notice: Subject to any disclaimer, the term of this patent is extended or adjusted under 35 U.S.C. 154(b) by 0 days.

(21) Appl. No.: 10/486,849

(22) PCT Filed: Sep. 12, 2002

(86) PCT No.: PCT/JP02/09389
§ 371 (c)(1),
(2), (4) Date: Feb. 12, 2004

(87) PCT Pub. No.: WO03/026370
PCT Pub. Date: Mar. 27, 2003

(65) Prior Publication Data
US 2004/0173371 A1  Sep. 9, 2004

(30) Foreign Application Priority Data
Sep. 14, 2001  (JP) .......................... 2001-280654

(51) Int. Cl.$^7$ ............................................. H01L 23/02
(52) U.S. Cl. ..................................... 174/52.4; 174/52.3
(58) Field of Search ............................. 174/52.1, 523, 174/52.4; 257/666, 668, 669, 701, 702, 704, 257/710, 698, 699, 708

(56) References Cited

U.S. PATENT DOCUMENTS

| | | | | |
|---|---|---|---|---|
| 4,614,836 A | * | 9/1986 | Carpenter et al. | 174/51 |
| 4,649,229 A | * | 3/1987 | Scherer et al. | 174/52.4 |
| 4,713,634 A | * | 12/1987 | Yamamura | 333/245 |
| 4,766,479 A | * | 8/1988 | Krum et al. | 257/737 |
| 4,961,106 A | * | 10/1990 | Butt et al. | 257/710 |
| 5,138,114 A | * | 8/1992 | Breit et al. | 174/52.4 |
| 5,223,672 A | * | 6/1993 | Pinneo et al. | 174/52.4 |
| 5,235,135 A | | 8/1993 | Knecht et al. | |
| 5,267,684 A | * | 12/1993 | Catheline et al. | 228/262.1 |
| 5,302,852 A | * | 4/1994 | Kaneda et al. | 257/704 |
| 5,365,108 A | * | 11/1994 | Anderson et al. | 257/678 |
| 5,448,452 A | | 9/1995 | Kondo et al. | |
| 5,506,446 A | * | 4/1996 | Hoffman et al. | 257/674 |
| 6,242,694 B1 | * | 6/2001 | Muraki | 174/52.3 |
| 6,262,362 B1 | * | 7/2001 | Czjakowski et al. | 174/35 R |
| 6,300,673 B1 | * | 10/2001 | Hoffman et al. | 257/666 |
| 6,400,015 B1 | * | 6/2002 | Fraser et al. | 257/730 |
| 6,489,677 B2 | * | 12/2002 | Okada et al. | 257/712 |

* cited by examiner

Primary Examiner—Hung V. Ngo
(74) Attorney, Agent, or Firm—W. F. Fasse; W. G. Fasse

(57) ABSTRACT

A surface mounting package includes a metal base with a lower surface having a through hole, a metal lead arranged to be inserted into the through hole, an insulating material filling in an internal space defined by the metal base, a cap covering the metal base as a lid, and an electronic part component arranged at a surface on the internal space side of the metal lead. The internal space is held at an air-tight atmosphere. The metal base has a lower surface positioned on the same plane as a lower surface of the metal lead or the insulating material, the same plane forming a plane to be attached to a mounting board.

16 Claims, 5 Drawing Sheets

SURFACE MOUNTING PACKAGE

TECHNICAL FIELD

The present invention relates to a surface mounting package for an electronic part component, and in particular, to a structure in which a metal lead is adhered to a metal base by an insulating material and exposed to the outside.

BACKGROUND ART

In a device such as a quartz resonator, a filter or an oscillator, as an electronic part for surface mounting, a surface mounting package to be a housing contains an electronic part component such as a piece of quartz, a piezoelectric device or the like. Examples of such a surface mounting package typically include four types of structures each having a base and a cap, as will be described below with Conventional Examples 1 to 4.

CONVENTIONAL EXAMPLE 1

A surface mounting package of Conventional Example 1 is formed, as shown in FIGS. 10 and 12, by first connecting a metal lead 6 for lead-out to a circular metal base 5 by a high-melting glass 7 which is an insulating adhesive (e.g. borosilicate), and then combining a cylindrical cap 8 shown in FIG. 11 therewith such that an opening end 8e is coupled around metal base 5 for sealing. As can be seen from FIG. 13, cylindrical cap 8 has legs 9 for holding its position, connected by welding or the like to an outer periphery of the cylindrical portion. Cylindrical cap 8 in such a package is made of metal for preventing entry of external electromagnetic wave that interferes with the function of a quartz resonator and the like.

CONVENTIONAL EXAMPLE 2

A surface mounting package of Conventional Example 2 is shown in FIG. 14. The package is formed by combining a box-shaped ceramic base 9 with a platy ceramic cap 10 for covering a box opening 9a. Only an insulator is used as a material for the package. If there is no concern about entry of electromagnetic wave, the package may be made of an insulator alone as in Conventional Example 2, not using a metal material as in Conventional Example 1.

CONVENTIONAL EXAMPLE 3

A surface mounting package of Conventional Example 3 is shown in FIG. 15. The package is formed by combining ceramic base 9 and a translucent glass cap 11 that serves as a top plate to cover a ceramic base opening 9a, and sealing the package with low-melting glass 31. The package uses a glass cap, so that oscillation frequency after sealing can easily be adjusted by laser trimming.

CONVENTIONAL EXAMPLE 4

A surface mounting package of Conventional Example 4 is shown in FIG. 16. The package is formed by combining ceramic base 9 with a metal cap 12. A metal thin film 14 (e.g. silver brazing filler metal) is formed on an upper surface at the opening side of a spacer 13 forming sidewalls of ceramic base 9. Metal thin film 14 and metal cap 12 are connected together by seam welding or electron-beam welding.

The surface mounting package according to Conventional Example 1, however, needs to ensure insulation between metal lead 6 and metal base 5 by providing an insulating material around metal lead 6, which increases the outer diameter of the package by a distance required for insulation, and thus adversely affects thinning of the package. As for other conventional techniques, each of the surface mounting packages according to Conventional Examples 2 to 4 has a limit on thinning of the package, since it is difficult to reduce a bottom-plate thickness 15 of the base due to constraints in the composition and characteristics of ceramic base 9 used as a base material. Excessive reduction in the dimension would adversely affect the air tightness, moisture resistance and strength of the package.

DISCLOSURE OF THE INVENTION

In view of the conventional circumstances as described above, an object of the present invention is to provide a surface mounting package that allows further reduction in the thickness.

To achieve the object, a surface mounting package according to the present invention employs a metal base in place of the combination of an insulating ceramic base and a cap. A metal lead for lead-out is provided at the bottom of the metal base having a surface to be attached to a mounting board. The metal lead is configured to have a lower surface coplanar with a lower surface of the metal base. By using metal as a base material, the bottom portion of the base, which had to be made thick to a certain degree when a ceramic base was used, can be made thinner. Moreover, the strength of the package can also be secured.

BEST MODES FOR CARRYING OUT THE INVENTION

The present invention will clearly be understood by the following description of embodiments.

First Embodiment

Figure 1:
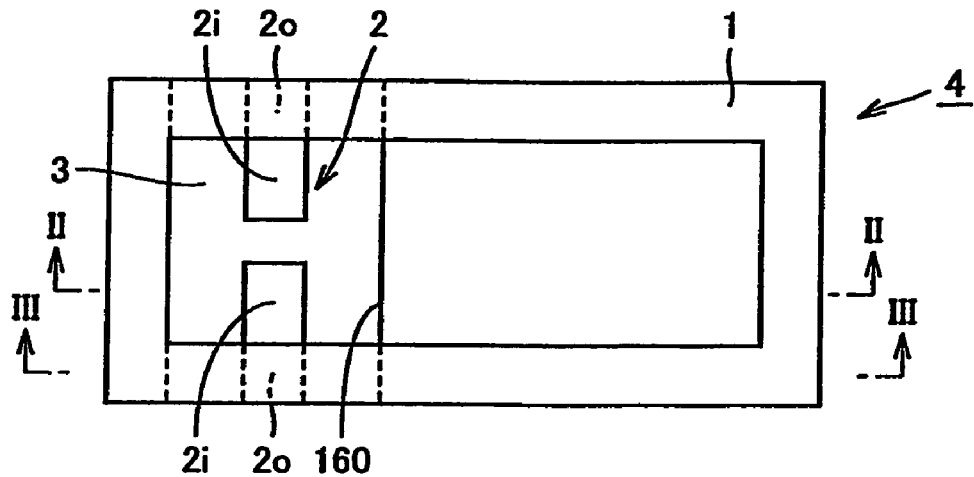
FIG. 1 is a plan view of a thin metal package as a surface mounting package in the first embodiment of the present invention.
Figure 2:
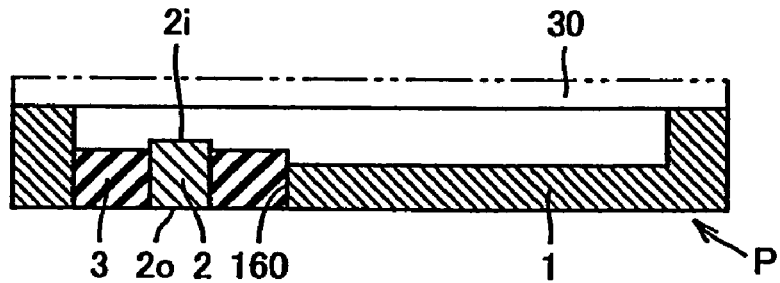
FIG. 2 is a section view taken along line II—II in FIG. 1 in the direction of the arrow.
Figure 3:
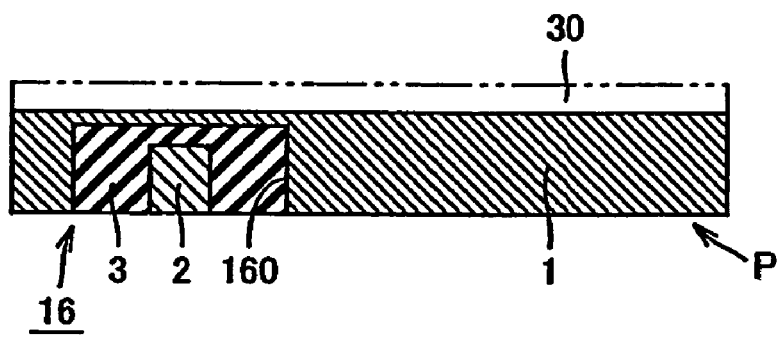
FIG. 3 is a section view taken along line III—III in FIG. 1 in the direction of the arrow.

The first embodiment of a surface mounting package for a quartz resonator according to the present invention will be described with reference to FIG. 1. In the present embodiment, the surface mounting package includes an assembled base 4 in which a metal base 1 and a metal lead 2 are adhered together by an insulating material 3, and a metal cap 30 illustrated by a chain double-dashed line. Metal base 1 constituting assembled base 4 forms a metal cavity structure (i.e. a structure in which a part of a metal box is cut out) as shown in FIG. 1, and has a base bottom portion 16 provided with a through hole 160. Metal lead 2 is of a quadrangular prism with an inner surface 2i and an outer surface 2o of the six surfaces serving as an inner electrode and an outer electrode, respectively. Metal lead 2 is shaped to be accommodated to metal base 1 and is inserted into a position corresponding to through hole 160. It is noted that FIGS. 2 and 3 are section views taken along lines II—II and III—III, respectively, in FIG. 1 in the direction of the arrows.

A surface 2o which is to be the lower surface of metal lead 2 and the lower surface of base bottom portion 16 form a plane P used when the package is attached to a mounting board. Plane P may be flat when it is fixed by brazing to a flat printed board or the like, but is formed to be a curved plane when it is attached to a cylindrical surface, to conform thereto.

Further, a gap space generated when metal lead 2 is inserted into metal base 1 is filled with e.g. borosilicate glass, which is high-melting glass, as an insulating material 3. Heat is applied to weld the insulating material, to adhere metal lead 2 to metal base 1. It is understood that Ag-based glass which is low-melting glass may be used as insulating material 3 for an electronic part component susceptible to high-temperature adhesion.

A quartz piece is fixed to a pair of lead electrodes 2 on assembled base 4 configured as described above. Metal base 1 is covered and coupled with a metal cap 30 indicated by chain double-dashed lines in FIGS. 2 and 3. In order to allow adjustment of oscillation frequency by applying ultraviolet light to an electronic part component after a surface mounting package is completed, borosilicate glass may be used in place of metal cap 30, in consideration of translucency.

Second Embodiment

Figure 4:
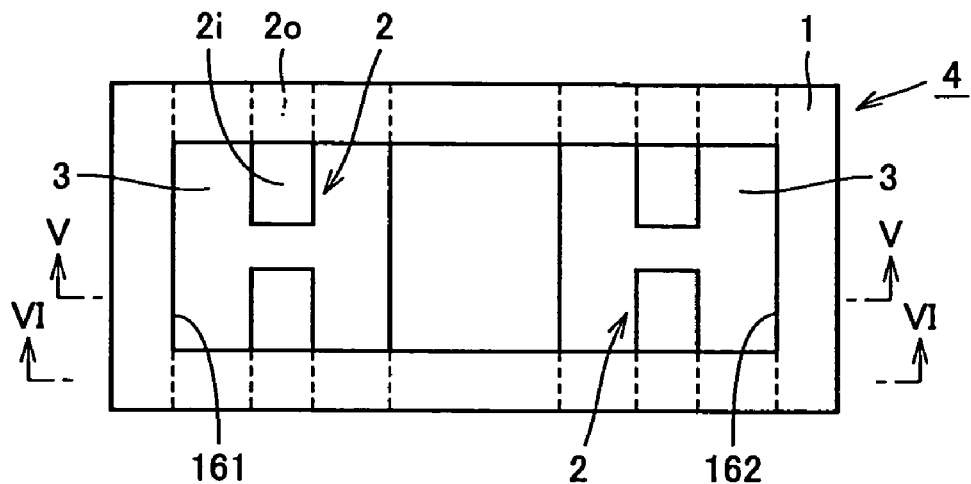
FIG. 4 is a plan view of a thin metal package as a surface mounting package in the second embodiment of the present invention.
Figure 5:
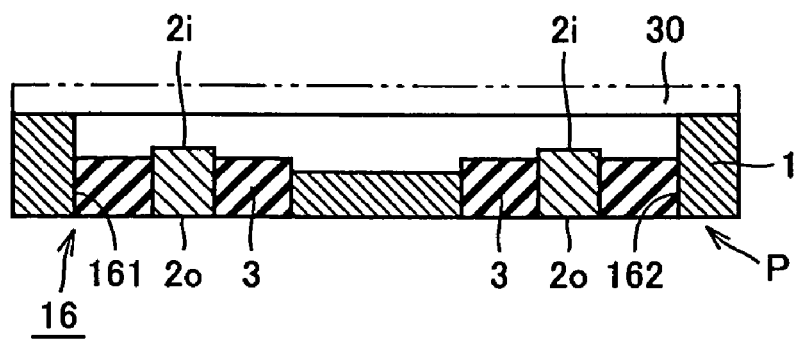
FIG. 5 is a section view taken along line V—V in FIG. 4 in the direction of the arrow.

The second embodiment of a surface mounting package for a quartz resonator according to the present invention will be described with reference to FIG. 4. The surface mounting package includes assembled base 4 in which metal base 1 and metal lead 2 are adhered together by insulating material 3, and a metal cap (not shown). Metal base 1 constituting assembled base 4 forms a metal cavity structure (i.e. a structure in which a part of a metal box is cut out) as shown in FIG. 1, and has base bottom portion 16 provided with two through holes 161, 162 as shown in FIG. 5. Metal lead 2 is of a quadrangular prism, two surfaces 2i and 2o of the six surfaces serving as an inner electrode and an outer electrode.

Figure 6:
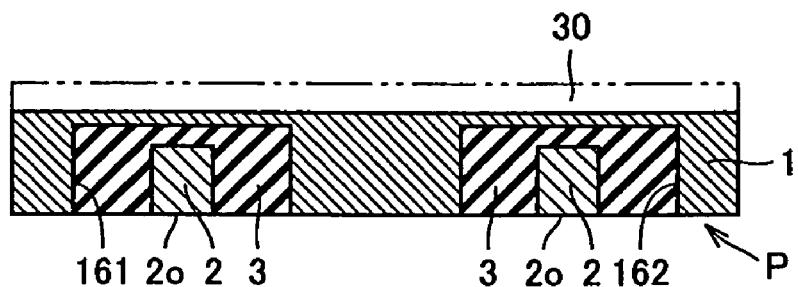
FIG. 6 is a section view taken along line VI—VI in FIG. 4 in the direction of the arrow.

Metal lead 2 is shaped to be accommodated to metal base 1 and inserted into a position corresponding to each of through holes 161, 162. It is noted that FIGS. 5 and 6 are section views taken along lines V—V and VI—VI, respectively, in FIG. 4 in the direction of the arrows.

Further, a gap space generated when metal lead 2 is inserted into metal base 1 is filled with insulating material 3 of high-melting glass. Heat is applied to weld the insulating material, to adhere metal lead 2 to metal base 1. Here, insulating material 3 may not necessarily be made of a glass-based material. For instance, polyimide-based resin and the like may also be used when the glass-based material is unacceptable due to the specification of an electronic part component.

As an electronic part component, for example, a piezoelectric device is fixed to a pair of lead electrodes 2 on assembled base 4 configured as described above. Metal base 1 is covered and coupled with metal cap 30 (not shown). It is noted that an oscillator including a filter and a semiconductor device may also be employed as an electronic part component. Metal lead 2 is not limited to a bar-shaped one with a rectangular section, but may have an approximately circular shape when the electronic part component uses small power and employs low current rating. Moreover, if a surface mounting package completely-shielded from electromagnetic wave is desired, metal cap 30 may be formed, for example, of an Fe—Co—Ni alloy.

Third Embodiment

Figure 7:
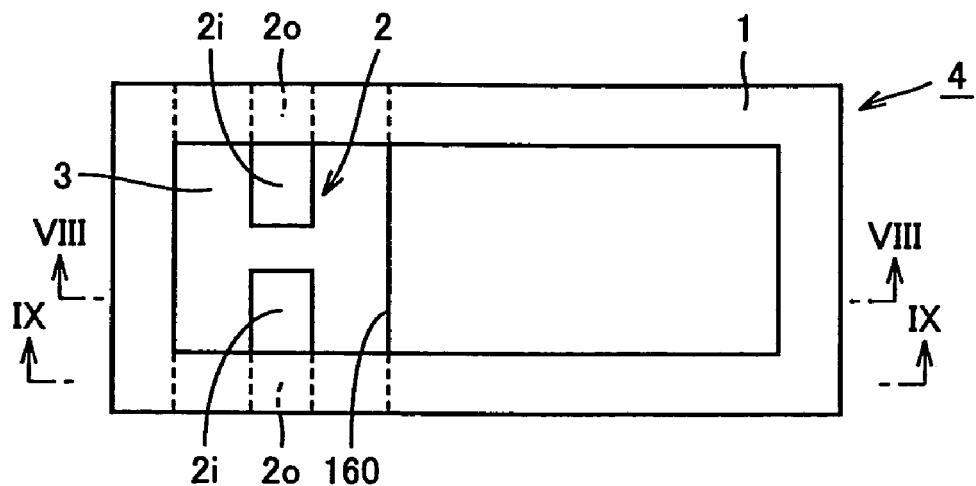
FIG. 7 is a plan view of a thin metal package as a surface mounting package in the third embodiment of the present invention.
Figure 8:
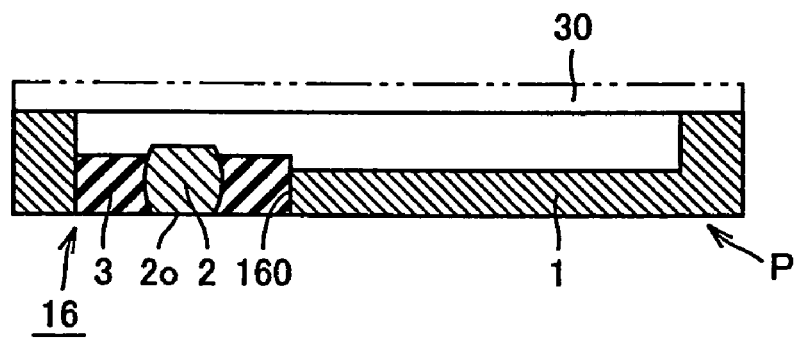
FIG. 8 is a section view taken along line VIII—VIII in FIG. 7 in the direction of the arrow.
Figure 9:
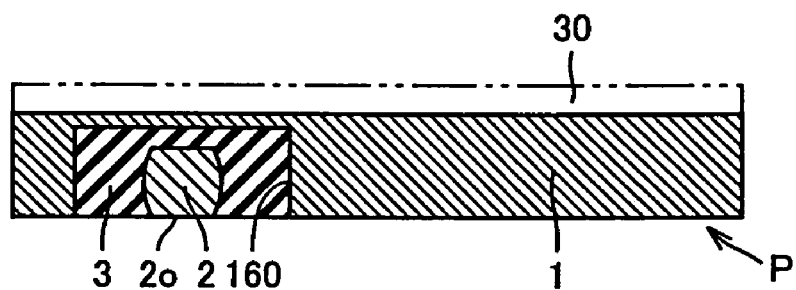
FIG. 9 is a section view taken along line IX—IX in FIG. 7 in the direction of the arrow.
Figure 10:
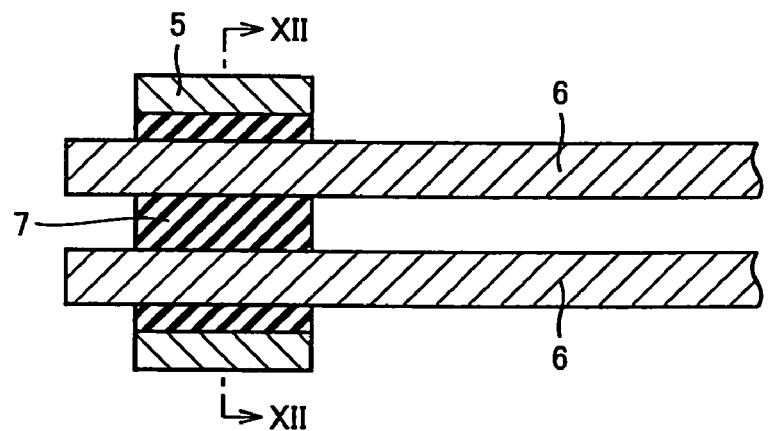
FIG. 10 is a section view showing the metal package in Conventional Example 1 of the surface mounting package.
Figure 11:
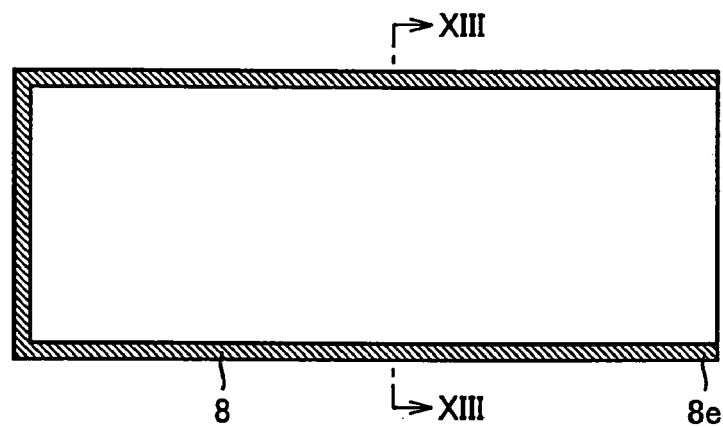
FIG. 11 is a section view taken along the direction of axis of a cylindrical cap for the metal package in Conventional Example 1 of the surface mounting package.
Figure 12:
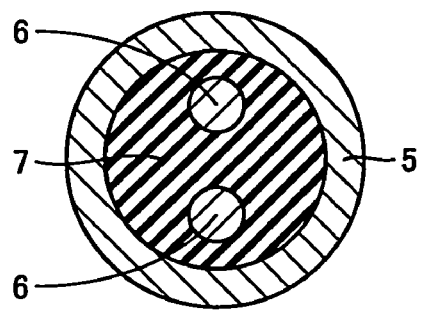
FIG. 12 is a section view taken along line XII—XII in FIG. 10 in the direction of the arrow.
Figure 13:
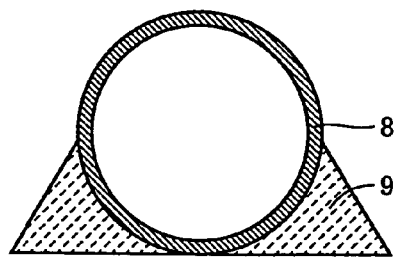
FIG. 13 is a section view taken along line XII—XIII in FIG. 11 in the direction of the arrow.
Figure 14:
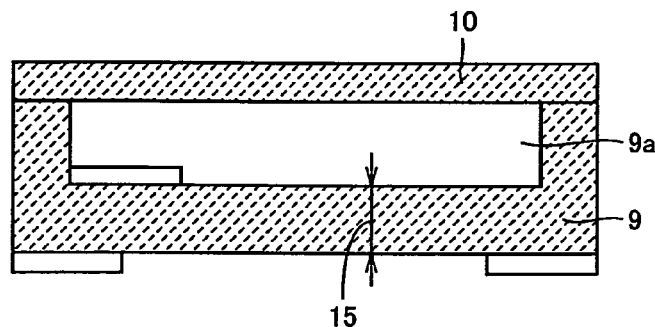
FIG. 14 is a section view of the ceramic package in Conventional Example 2 of the surface mounting package.
Figure 15:
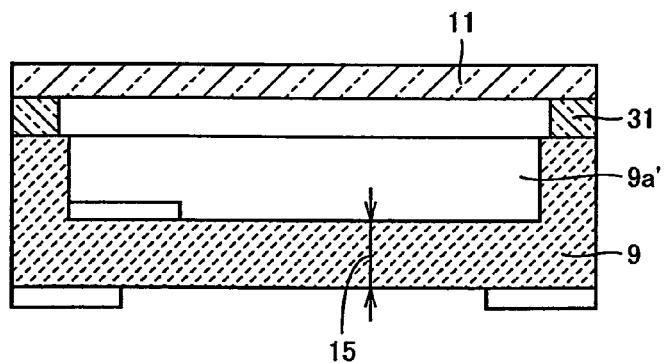
FIG. 15 is a section view of the ceramic package in Conventional Example 3 of the surface mounting package.
Figure 16:
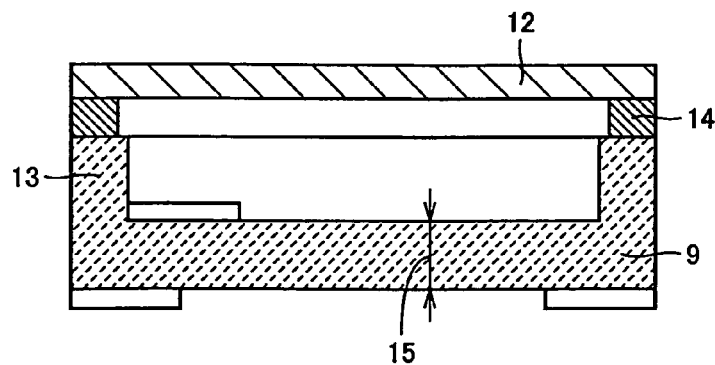
FIG. 16 is a section view showing the package in Conventional Example 4 formed by combining a metal cap with a ceramic base.

The third embodiment of a surface mounting package for a quartz resonator according to the present invention will be described with reference to FIG. 7. The surface mounting package includes assembled base 4 in which metal base 1 and metal lead 2 are adhered together by insulating material 3, and a metal cap (not shown). Metal base 1 constituting assembled base 4 forms a metal cavity structure (i.e. a structure in which a part of a metal box is cut out) as shown in FIG. 1, and has a base bottom portion 16 provided with one through hole 160. Metal lead 2 is of a quadrangular-prism-like shape having a curved surface, two surfaces 2i and 2o of the six surfaces serving as an inner electrode and an outer electrode. Metal lead 2 is shaped to be accommodated to metal base 1 and inserted into a position corresponding to through hole 160. It is noted that FIGS. 8 and 9 are section views taken along lines VIII—VIII and IX—IX in FIG. 7, respectively, in the direction of the arrows.

Further, a gap space generated when metal lead 2 is inserted into metal base 1 is filled with borosilicate glass, which is high-melting glass, as insulating material 3. Heat is applied to weld the insulating material, to adhere metal lead 2 to metal base 1.

A piezoelectric device is fixed to a pair of lead electrodes 2 on assembled base 4 configured as described above. Metal base 1 is covered and coupled with a metal cap (not shown). Here, for example, Ag-based glass may also be used as insulating material 3 when an electronic part component desires no high-melting glass as an insulating material.

While the lower surface of metal lead 2 was coplanar with that of metal base 1 in the embodiments above, the lower surface of insulating material 3, instead of metal lead 2, may have the same plane as the lower surface of metal base 1. Alternatively, as illustrated, the lower surfaces of metal lead 2, insulating material 3 and metal base 1 may all be on the same plane.

As can be understood from the description above, the surface mounting package according to the present invention eliminates the need for providing an insulating material around a metal lead as in a conventional package (Conventional Example 1), allowing the package to be made thinner and smaller. By changing a base material from ceramic to metal, the air tightness, moisture resistance and strength of the package can be secured even if the base bottom plate portion has a small thickness.

INDUSTRIAL APPLICABILITY

The present invention may be applicable to a surface mounting package used in surface mounting of an electronic part component such as a quartz resonator, a filter, an oscillator and the like, and is useful in further thinning of the surface mounting package.

What is claimed is:

1. A surface mounting package, comprising:
   a metal base with a lower surface having a through hole;
   a metal lead arranged in said through hole;
   an insulating material filling in an internal space defined by said metal base;
   a cap covering said metal base as a lid; and
   an electronic part component arranged at a surface on said internal space side of said metal lead,
   said internal space being held at an air-tight atmosphere, said metal base having a lower surface positioned on a same plane as a lower surface of said metal lead, said same plane forming a plane to be attached to a mounting board.

2. The surface mounting package according to claim 1, wherein said plane to be attached is a flat plane.

3. The surface mounting package according to claim 1, wherein said plane to be attached is a curved plane.

4. The surface mounting package according to claim 1, wherein said electronic part component is adhered by a high-melting solder.

5. The surface mounting package according to claim 1, wherein said metal lead is a bar with a rectangular section.

6. The surface mounting package according to claim 1, wherein said metal lead is a bar with an approximately circular section.

7. The surface mounting package according to claim 1, wherein said insulating material is high-melting glass.

8. The surface mounting package according to claim 1, wherein said insulating material is low-melting glass.

9. The surface mounting package according to claim 1, wherein said insulating material is a polyimide-based resin material.

10. The surface mounting package according to claim 1, wherein said cap is made of a metal Fe—Ni—Co alloy.

11. The surface mounting package according to claim 1, wherein said cap is borosilicate glass.

12. The surf ace mounting package according to claim 1, wherein said insulating material has a lower surface positioned on said same plane.

13. A surface mounting package comprising:
   a metal base including a bottom plate portion having a first lower surface, and having a through hole that penetrates from said first lower surface through a thickness of said bottom plate portion and that is bounded by said metal base all around a perimeter of said through hole;
   a cap covering said metal base so as to enclose and seal an interior cavity between said cap and said metal base;
   a metal lead arranged in and extending through said through hole, from a second lower surface of said metal lead lying on a same common plane with said first lower surface of said bottom plate portion, into said interior cavity;
   an insulating material filling a remainder of said through hole all around said metal lead between said metal lead and said perimeter of said through hole; and
   an electronic component arranged in said interior cavity and connected to said metal lead;
   wherein said common plane of said first lower surface and said second lower surface forms a mounting plane of said surface mounting package adapted to be attached to a mounting board.

14. The surface mounting package according to claim 13, wherein said insulating material has a third lower surface lying on said same common plane with said first and second lower surfaces.

15. The surface mounting package according to claim 13, wherein said metal base further includes a sidewall portion protruding from said bottom plate portion away from said first lower surface toward said cap, said through hole further extends to and penetrates through a thickness of said sidewall portion, and said metal lead further extends laterally outwardly through said thickness of said sidewall portion in said through hole.

16. The surface mounting package according to claim 13, wherein a longest dimension of said metal lead extends laterally, parallel to said bottom plate portion, along said second lower surface that lies on said same common plane with said first lower surface.

* * * * *